United States Patent [19]

Eldridge et al.

[11] 3,816,173

[45] June 11, 1974

[54] FABRICATION OF VARIABLE CURRENT DENSITY JOSEPHSON JUNCTIONS

[75] Inventors: Jerome Michael Eldridge; Juri Matisoo, both of Yorktown Heights, N.Y.

[73] Assignee: International Business Machines Corporation, Armonk, N.Y.

[22] Filed: Nov. 29, 1972

[21] Appl. No.: 310,307

[52] U.S. Cl. .............................. 117/217, 317/235 T

[51] Int. Cl. .............................................. H01l 3/00

[58] Field of Search .............. 317/235 T; 331/107 S; 307/306; 117/212, 217; 29/599

[56] References Cited

UNITED STATES PATENTS 3,394,317 7/1968 Giaever ................................ 330/62

3,733,526 5/1973 Anacher .......................... 317/234 R

*Primary Examiner*—Martin H. Edlow

*Attorney, Agent, or Firm*—George Baron

[57] ABSTRACT

Alloying the base electrode of a lead-oxide-lead Josephson tunnel junction with indium will effectively result in an oxide having a low barrier height. Consequently, much thicker barriers can be produced without severely limiting the magnitude of the tunnel current. Furthermore, by varying the indium concentration in an array of Pb-In electrodes on a single chip, one can produce various different functioning devices while employing only a single oxidation process.

7 Claims, 6 Drawing Figures

FABRICATION OF VARIABLE CURRENT DENSITY JOSEPHSON JUNCTIONS

CROSS-REFERENCE TO RELATED APPLICATIONS

A commonly-assigned application entitled "Lead Josephson Junction Devices" by W. Anacker et al, Ser. No. 103,236, filed 12/31/70 teaches incorporating indium in a lead electrode of a Josephson junction in order to provide resistance to hillock formation and obtain dense and uniform tunnel barriers. However that application does not suggest the range of constitutents in the tunnel barrier for tailoring the barrier height of a Josephson junction. In the present invention, the tunnel barrier is tailored to give a range of maximum Josephson currents for a fixed barrier thickness.

BACKGROUND OF THE INVENTION

The phenomenon of superconductive electron tunneling is one which is well known and occurs when superposed strips of superconductive metals are insulated from each other except for an area which is most often called the tunneling junction and which consists of an oxide layer of one of the two superconductive metals. Generally, the thickness of this oxide film will be less than 50 angstroms, and most likely of the order of 30 angstroms. At such thin layers of insulation, the oxide film nevertheless must be continuous, uniform and free of pinholes. When a source of current is connected to the two metal films separated by the oxide layer, electron tunneling occurs at the tunneling junction and different results will be effected depending upon the conditions superimposed upon the system. For Josephson junction tunneling, there is current flow through the tunneling junction without any voltage drop up to a critical current, $I_j$, above which a voltage drop appears with current flow.

It is also known that the thinner the oxide layer between the two superconducting electrodes forming the Josephson junction, more current can flow through the Josephson junction. Conversely, as the oxide layer is made thicker, using the same superconducting metals for forming the Josephson electrodes, less current flows through the junction. For a fixed oxide thickness, more or less current can be made to flow through the junction by lowering or raising the barrier height. The current density $$j_{max} = ae^{(d_{ox}\phi^{1/2})k},$$

where $a$ and $k$ are constants and $d_{ox}$ is oxide thickness and $\phi$ is barrier height and $j_{max}$ is Josephson current density.

In order to manufacture Josephson junctions and achieve greater reproducibility, it would be helpful if the oxide layer can be made thicker, of the order of 50A to over 70A, in that such increased thickness will diminish the incidence of pinholes and diminish the very accurate controls and testing procedures needed to reproducibly make oxide layers no thicker than 30A. Additionally, the use of a lower barrier height oxide also drastically reduces the sensitivity of the tunnel current to oxide thickness changes. However, no advance in the art is attained if the increased thickness is not accompanied by a lowering of the barrier height of the Josephson junction manufactured.

The present invention provides a means for growing oxides for Josephson junctions while, at the same time, effectively decreasing the barrier height of the insulation region of the junction. If, in the normal Josephson junction composed of Pb/PbO/Pb, an oxide of an alloy of indium and lead is employed so as to achieve the junction Pb/PbO-$In_2O_3$/Pb, the oxide of the latter insulation, even though considerably thicker than that of PbO, has the same current density as that of the Pb/PbO/Pb film. That means, that not only can thicker insulating regions now be employed in the making of Josephson junctions, without sacrificing tunneling capability, but one can now fabricate, on a single chip using a single oxidation step, junctions having predetermined current densities. For example, for a Josephson junction having a 32A thick oxide film, where the oxide is thermally grown on a 3 mol % In and 97 mol % Pb alloy, a current density of 575 amps/cm$^2$ was observed through the junction as contrasted with only 1 amp/cm$^2$ of tunneling current for a 32A thick film of PbO thermally grown on a lead electrode of such a junction.

By controlling the composition of the Pb-In alloy and its oxidation for different locations on a single chip, representative materials for the chip being silicon, glass, etc., junctions having different predetermined current densities may be formed on such chip. Different circuit functions on a given chip may call for junctions having different current densities to be fabricated at the same time by varying the indium concentration of the base electrode.

Consequently, it is an object of this invention to increase the thicknesses of the oxide layers of Josephson junctions and to decrease the barrier heights of such oxide layers, thereby obtaining similar or higher current densities.

A further object is to create increased thicknesses of the oxide layer of a Josephson junction yet not increase the barrier heights of such oxide layer, employing a composite alloy of Pb and In as an electrode of the Josephson junction that is to be oxidized.

Yet another object is to prepare large arrays of alloy islands of Pb and In on electrodes forming Josephson junctions whereby selected islands will have predetermined current densities different from one another.

The foregoing and other objects, features, and advantages of the invention will be apparent from the following more particular description of the preferred embodiments of the invention as illustrated in the accompanying drawings.

BRIEF DESCRIPTION OF THE DRAWINGS

FIG. 5 is a plot of tunneling current density versus oxide thickness for different alloy compositions of Pb and In.

DESCRIPTION OF PREFERRED EMBODIMENT

Superconducting tunnel devices, their operation and properties, have been treated in such articles as "The Tunneling Cryotron — A Superconductive Logic Element Based on Electron Tunneling" by J. Matisoo which appeared in the Proceedings of the IEEE, Vol. 55, No. 2, February 1968, pp. 172–180 or in two U.S. issued patents U.S. Pat. No. 3,370,210 to Fiske or U.S. Pat. No. 3,423,607 to Kunzler et al.

Figure 1:
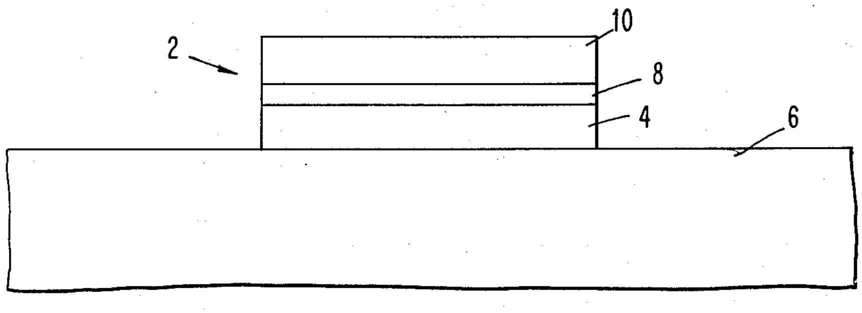
FIG. 1 is a showing of a Josephson junction manufactured in accordance with the teachings of this invention.

The typical Josephson junction comprises two superconductive metal electrodes separated by an insulating layer formed by oxidizing one of the metal electrodes. Normally, to achieve high tunneling current densities between the electrodes flowing through the insulator, the latter must be exceedingly thin, of the order of 30A or less. However, in order to make 30A layers uniform and reproducible, extreme care in manufacturing is required, entailing expensive temperature, thickness, pressure, etc. sensors for monitoring the fabrication steps. An acceptable Josephson junction comprises two layers of Pb separated by a 30A layer of PbO formed by thermal oxidation of one Pb electrode. FIG. 1 shows the typical Josephson junction 2 made by depositing a first layer of Pb 4 on a suitable inert substrate 6, such as glass, and thermally growing an oxide layer 8 on the lead film 4, prior to depositing the second layer of lead 10 on the oxide layer 8. Suitable contacts and leads, not shown, are connected to each electrode 4 and 10, respectively.

Figure 2:
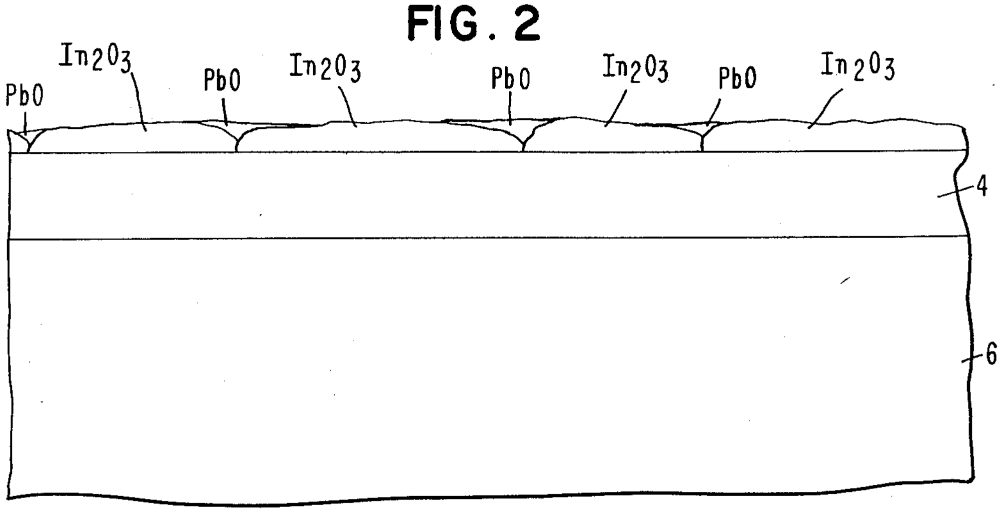
FIG. 2 is a schematic showing of how the solid solution of an In-Pb film is oxidized.

However, the oxide layer 8 is grown differently than conventionally grown oxide layers in this respect. As set forth in the aforementioned copending application, Ser. No. 103,236, filed 12/31/70, two separate sources, one of In and one of Pb, are placed in the vacuum chamber and heated to be vapor deposited upon a ceramic substrate. Using appropriate monitoring and control devices known in the art, the two crucibles housing the In and Pb, respectively, are maintained at different temperatures so that different ratios of Pb and In can be deposited as an alloyed film on a ceramic substrate to form the first metal layer of a Josephson junction. As seen in FIG. 2, the oxidized film grown on the Pb-In alloy film is a combination of PbO and $In_2O_3$ and the desired oxide thickness of the combined oxidized film is a function of time, oxygen pressure and temperature of the Pb-In alloy film.

Figure 3:
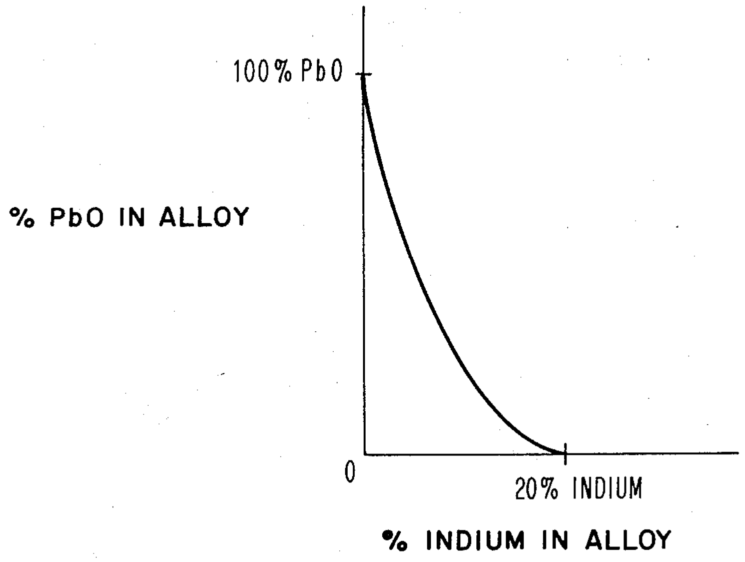
FIG. 3 is a plot of the volume fraction of PbO to that of In in the Pb-In alloy.

The indium tends to oxidize faster than the lead. This fact is exploited to tailor the oxide composition to the alloy composition. Since PbO/$In_2O_3$ is a function of the percent indium in the In-Pb alloy, when enough indium is deposited, it becomes the dominant metal of the alloy to oxidize. As seen in FIG. 3, when the alloy is made up of 80% lead and 20% indium, all the oxide grown is $In_2O_3$. Experimental results indicate that increased amounts of $In_2O_3$ in a Josephson junction made up of Pb-PbO/$In_2O_3$-Pb lowers the barrier height of the insulated layer.

Figure 4:
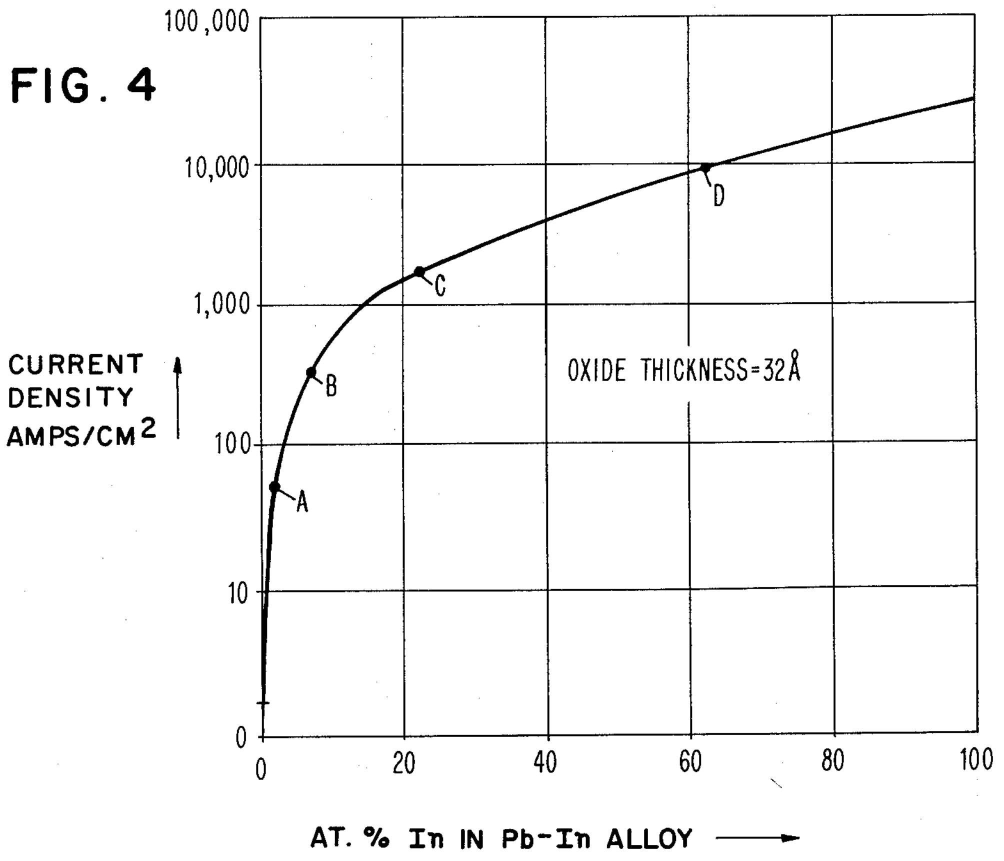
FIG. 4 is a plot of the tunneling current density in amps/cm$^2$ against the third power of the volume % of $In_2O_3$.

In FIG. 4, the log of the critical current $I_j$ is plotted against the percent In in the Pb-In alloy, employing a constant oxide thickness of 32A for the PbO/$In_2O_3$. As the plot indicates, the critical current through the Josephson junction increases rapidly as the percent of In increases. When the oxide of the alloy contains about 1.0 atomic % In, then $I_j$ is about 10 amps/cm$^2$. With about 5 atomic % In in the alloy, then the critical current is about 100 amps/cm$^2$. When the oxide is entirely $In_2O_3$, then the Josephson junction has a critical current of about $10^4$amps/cm$^2$. It becomes quite evident that one can obtain large critical currents for a given oxide thickness by increasing the indium content of the barrier layer forming the insulation of the Josephson junction.

Figure 5:
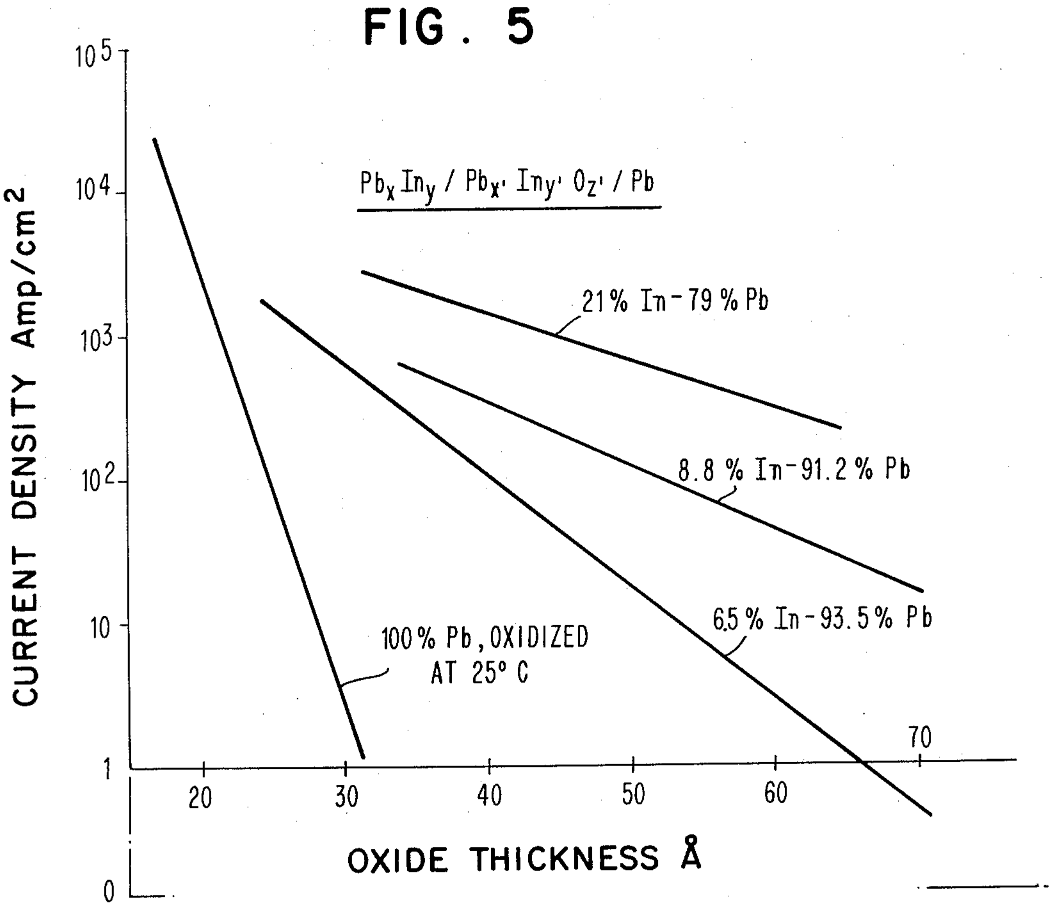

In FIG. 5, it is seen that a Josephson junction composed of Pb/$Pb_xIn_yO_z$/Pb, having differing oxidized layers grown at the same temperature, have different, effective barrier heights. For a 70A thick film where the oxide is only PbO, only negligible current flows through the junction. Where the oxide comprises 6.5% In and 93.5% Pb, a 70A thick oxide carries a Josephson current density of about 0.8 amps/cm$^2$. When the amount of In is increased so as to be 8.8% In and 91.2% Pb, the critical current $j_{max}$ is about 25 amps/cm$^2$ and when the alloy oxide contains 21% In and 79% Pb, the critical current is about 230 amps/cm$^2$. Thus thick oxide layers, e.g., >50A, can now be used for practical devices.

The addition of In to superconducting electrodes by vapor deposition, ion implantation, doping, or the like, of the metal oxide with indium not only lowers the barrier height of an M–O–M device, it also has the following desirable effects. For a given junction area and desired current density, the oxide thickness can be increased. Such increased thickness improves yield of manufacture by diminishing the incidence of shorts, thus raising device reliability. Additionally, device reliability is no longer so strongly dependent on oxide thickness. The invention also encompasses materials to be alloyed with lead other than indium. Metals with a valence greater than 2, such as T1, Sn and Bi, are substitutable for indium in the alloy forming the electrode on which the compound oxide is grown.

Figure 6:
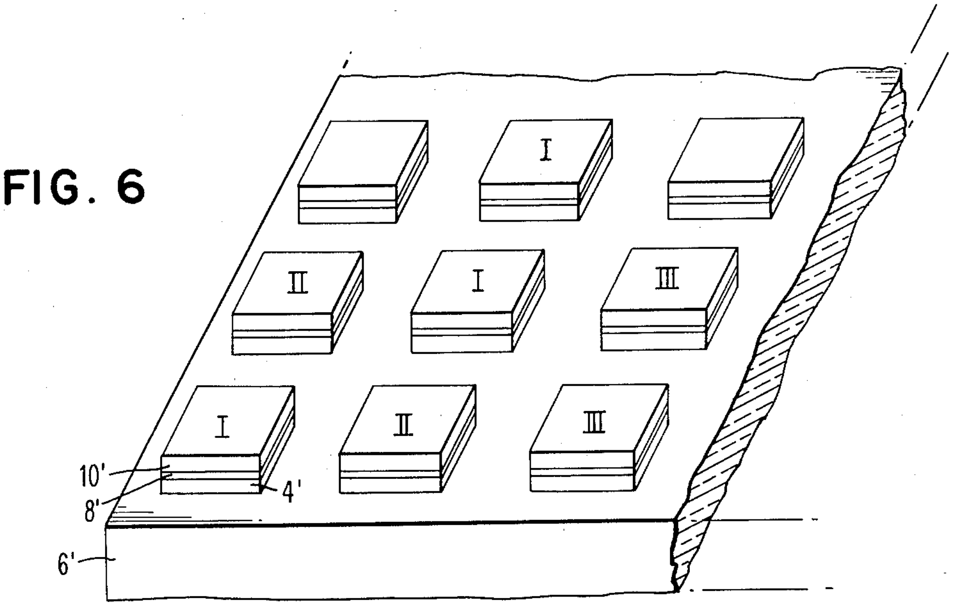
FIG. 6 is an array of Josephson junctions on a single chip wherein chosen Josephson junctions have different compositions of Pb-In alloy than other Josephson junctions, and they in turn have different compositions of Pb-In alloy from a third group of Josephson junctions, etc.

The teachings herein can be extended to the making of an array of devices on a single chip using a single oxidation step. The array will consist of junctions having different predetermined current densities. As seen in FIG. 6, a bottom alloy electrode film 4' is prepared by vacuum deposition techniques on a ceramic substrate 6'. The alloy is preferably In-Pb, although other alloys such as Te-Pb, Sn-Pb, Bi-Pb or combinations of In, Te, Sn and Bi with superconducting metals other than Pb can be used. By using standard photoresist and etching techniques, large arrays of alloy islands are prepared. Islands would contain the percent of indium alloy represented by point A on the curve of FIG. 4, other islands would contain a percent of In shown at point B on the curve, still other islands would have a percent of In in the In-Pb alloy shown by points C, D, etc. on such curve. The exact amount of In, or its equivalent, that is added will be determined by the ultimate function of the device in the chip array. As seen in FIG. 6, islands are labelled I, II, III, etc. Those islands having a given label will perform the same function as any other in the family of devices having the same label.

It should be realized that FIG. 6 is schematic and shows only the junction portion of a circuit. As is well known, the junctions and their associated control layers will be appropriately interconnected.

The constituent that is added to lead can be added in a controlled manner by vacuum deposition or ion implantation using photoresist or other means to selectively mask off the surfaces of those islands whose compositions are not to be changed. Formation of the oxide layers 8' on the islands can be carried out thermally in oxygen, in an r.f. plasma, or by any other suitable oxidizing procedure. The resultant oxide thickness 8' and its barrier potential is fixed by the concentration of the In or its equivalent in an island for a given oxidation process. The Josephson junction is completed by evaporating a metal electrode 10' on each island while the array is in the same vacuum chamber.

What is claimed is:

1. In a method for controlling the height of the tunnel barrier, and therefore its maximum tunneling current, for a given oxide thickness of a Josephson junction comprising the steps of a. providing an alloyed electrode of lead and indium, wherein said indium varies from 1 to 20% by weight of the Pb-In alloy,
b. oxidizing said alloy to produce an oxide consisting of PbO and $In_2O_3$ on the surface of said electrode, and
c. selecting the ratio of Pb to In in said alloyed electrode so as to obtain a desired $PbO/In_2O_3$ ratio, said ratio fixing the tunnel barrier height for said given thickness of oxide.

2. In a method for controlling the height of the tunnel barrier, and therefore its maximum tunneling current, for a given oxide thickness of a Josephson junction comprising the steps of a. providing an alloyed electrode of lead and tellurium, wherein said tellurium varies from 1 to 20% by weight of the Pb-Te alloy,
b. oxidizing said alloy to produce an oxide consisting of lead oxide and tellurium oxide on the surface of said electrode, and
c. selecting the ratio of Pb to Te in said alloyed electrode so as to obtain a desired lead oxide to tellurium oxide ratio, said ratio fixing the tunnel barrier height for said given thickness of oxide.

3. In a method for controlling the height of the tunnel barrier, and therefore its maximum tunneling current, for a given oxide thickness of a Josephson junction comprising the steps of a. providing an alloyed electrode of lead and tin, wherein said tin varies from 1 to 20% by weight of the Pb-Sn alloy,
b. oxidizing said alloy to produce an oxide consisting of lead oxide and tin oxide on the surface of said electrode, and
c. selecting the ratio of Pb to Sn in said alloyed electrode so as to obtain a desired lead oxide to tin oxide ratio, said ratio fixing the tunnel barrier height for said given thickness of oxide.

4. In a method for controlling the height of the tunnel barrier, and therefore its maximum tunneling current, for a given oxide thickness of a Josephson junction comprising the steps of a. providing an alloyed electrode of lead and bismuth said bismuth varies from 1 to 20% by weight of the Pb-Bi alloy,
b. oxidizing said alloy to produce an oxide consisting of lead oxide and bismuth oxide on the surface of said electrode, and
c. selecting the ratio of Pb to Bi in said alloyed electrode so as to obtain a desired lead oxide to bismuth oxide ratio, said ratio fixing the tunnel barrier height for said given thickness of oxide.

5. In a method for controlling the height of the tunnel barrier, and therefore its maximum tunneling current, for a given oxide thickness of a Josephson junction comprising the steps of a. providing an alloyed electrode of lead and a metal having a valence greater than 2,
b. oxidizing said alloy to produce an oxide consisting of PbO and the oxide of metal on the surface of said electrode, and
c. selecting the ratio of Pb to said metal in said alloyed electrode so as to obtain a desired lead oxide to metal oxide ratio, said ratio fixing the tunnel barrier height for said given thickness of oxide.

6. In a method for making an array of Josephson junction devices on a single chip comprising the steps of a. providing a plurality of discrete superconductive electrodes on an insulated substrate,
b. incorporating different amounts of indium in selected groups of electrodes in said array,
c. oxidizing said electrodes so as to obtain a different metal oxide-indium-oxide ratio for each group in said array, and
d. depositing a second superconductive electrode on each oxidized layer in said array whereby an array of Josephson junctions is produced wherein each group has different critical currents than any of the other groups even though oxidized at the same time.

7. In a method for making an array of Josephson junction devices on a single chip comprising the steps of a. providing a plurality of discrete superconductive electrodes on an insulated substrate;
b. incorporating different amounts of a metal having a valence greater than 2 in selected groups of electrodes in said array;
c. oxidizing said electrodes so as to obtain a different electrode oxide-metal oxide ratio for each group in said array; and
d. depositing a second superconductive electrode on each member of each group whereby an array of Josephson junctions is produced wherein each group has different critical currents than any of the other groups even though oxidized at the same time.

* * * * *